US007675426B2

(12) United States Patent
Takada et al.

(10) Patent No.: US 7,675,426 B2
(45) Date of Patent: Mar. 9, 2010

(54) RELAY

(75) Inventors: Tsutomu Takada, Osaka (JP); Nobuyuki Hidaka, Osaka (JP); Shigeru Tsujimura, Osaka (JP)

(73) Assignee: IDEC Corporation, Osaka (JP)

( * ) Notice: Subject to any disclaimer, the term of this patent is extended or adjusted under 35 U.S.C. 154(b) by 356 days.

(21) Appl. No.: 11/792,956

(22) PCT Filed: Dec. 12, 2005

(86) PCT No.: PCT/JP2005/022766

§ 371 (c)(1), (2), (4) Date: Jun. 13, 2007

(87) PCT Pub. No.: WO2006/064758

PCT Pub. Date: Jun. 22, 2006

(65) Prior Publication Data

US 2008/0224878 A1 Sep. 18, 2008

(30) Foreign Application Priority Data

Dec. 13, 2004 (JP) ............................ 2004-359606

(51) Int. Cl.
*G08B 21/00* (2006.01)
*G01R 31/02* (2006.01)

(52) U.S. Cl. ........................ 340/644; 340/641; 324/418

(58) Field of Classification Search ................. 340/644, 340/641; 324/418–423
See application file for complete search history.

(56) References Cited

U.S. PATENT DOCUMENTS 4,147,977 A * 4/1979 Dimmick ................ 324/121 R
4,479,117 A * 10/1984 Marquardt .................. 340/644

FOREIGN PATENT DOCUMENTS

| | | |
|---|---|---|
| JP | 45-29959 | 11/1970 |
| JP | 55-15635 | 4/1980 |
| JP | 57-154736 | 9/1982 |

(Continued)

OTHER PUBLICATIONS

International Search Report, Issued in International Patent Application No. PCT/JP2005/022766, dated on Feb. 28, 2006.

(Continued)

*Primary Examiner*—Jennifer Mehmood
(74) *Attorney, Agent, or Firm*—McDermott Will & Emery LLP

(57) ABSTRACT

A light guide part (20) is provided along a Z-axis on a side surface of a case (2) of a relay (1). The light guide part is a thick portion formed of a material forming the side surface of the case, and is structurally integral with the other parts of the case. Also, a light emitting device which emits light in response to application of a voltage to coil terminals (41) is provided within the relay (1) (case). A reflection surface (201) which reflects illuminating light emitted from the light emitting device in a (+Y) direction in a (+Z) direction is placed at a lower end of the light guide part. Illuminating light reflected by the reflection surface is guided to a display surface (200) placed at an upper end of the light guide part, to illuminate the display surface.

4 Claims, 3 Drawing Sheets

FOREIGN PATENT DOCUMENTS

| | | | |
|---|---|---|---|
| JP | 03-049123 | | 3/1991 |
| JP | 06295653 | * | 10/1994 |
| JP | 08-184713 | | 7/1996 |

OTHER PUBLICATIONS

Microfilm of the Specification and drawings annexed to the request of Japanese Utility Model Application No. 83026/1978 (Laid-open No. 183658/19790), Dec. 26, 1979.

Microfilm of the specification and Drawings annexed to the request of Japanese Utility Model Application No. 105481/1975 (Laid-open No. 38332/1977), Mar. 18, 1977.

Microfilm of the Specification and Drawings annexed to the request of Japanese Utility Model Application No. 108285/1976 (Laid-Open No. 24828/1978), Mar. 2, 1978.

Japanese Office Action, with English Translation, issued in Japanese Patent Application No. JP 2004-359606, dated Jan. 13, 2009.

* cited by examiner

RELAY

RELATED APPLICATIONS

This application is the U.S. National Phase under 35 U.S.C. §371 of International Application No. PCT/JP2005/022766, filed on Dec. 12, 2005, which in turn claims the benefit of Japanese Application No. 2004-359606, filed on Dec. 13, 2004, the disclosures of which Applications are incorporated by reference herein.

TECHNICAL FIELD

The present invention relates to techniques for indicating operations of a relay.

BACKGROUND ART

In a conventional relay, an operation indicator is provided, by which an operator makes a functional check on the relay. Such the operation indicator is provided in the vicinity of a ceiling of the relay (a top surface of a box), in general, in order to allow an operator to visually recognize a lighting situation more easily.

However, terminals used for supplying power to the relay (including the operation indicator) are usually located on a bottom surface of the relay. For this reason, there has been a need for laying a relatively long wire which extends from the terminals to the operation indicator placed in the vicinity of the ceiling of the relay.

On the other hand, in recent years, there is an increasing demand for scale-down of electronic components such as a relay. However, a smaller relay has a disadvantage that a space for an operation indicator cannot be saved in the vicinity of a ceiling thereof in some cases. In those cases, an operation indicator has no choice but to be placed apart from a ceiling. However, such location of the operation indicator causes a problem that an operator has difficulties in visually recognizing a lighting situation.

DESCRIPTION OF THE INVENTION

The present invention is directed to a relay for opening and closing a circuit by an electromagnetic interaction between a coil and an oscillation part.

According to the present invention, the relay includes: a hollow box for housing the coil and the oscillation part; and an illuminating part which lights up depending on a supply situation of power supplied to the coil, wherein the box includes: a display surface placed in a predetermined position; and a light guide part for guiding light emitted from the illuminating part toward the display surface, and the display surface and the light guide part are formed as integral parts forming the box.

As a result, it is possible to illuminate the display surface while placing the illuminating part in an arbitrary position without increasing the number of components, regardless of the position of the display surface. Accordingly, it is possible to effectively use a space while suppressing an increase in cost.

Also, the light guide part guides light traveling toward other than the display surface of the light emitted from the illuminating part, toward the display surface.

As a result, it is possible to efficiently illuminate the display surface even if a shield exists between the illuminating part and the display surface, for example. Also, it is possible to freely design a direction in which the illuminating part emits light.

Also, the light guide part includes a reflection surface for reflecting the light emitted from the illuminating part toward the display surface, and a position of the reflection surface and an angle at which the reflection surface is placed are set such that the reflection surface almost totally reflects the light emitted from the illuminating part toward the reflection surface, depending on relative positions of the box and the illuminating part.

As a result, it is possible to efficiently guide illuminating light to the display surface.

Also, surface roughening is applied to an area of the box, which area surrounds the display surface.

As a result, it is possible to emphasize the condition of the display surface by scattering light which leaks from the area surrounding the display surface. Accordingly, the visibility of the display surface to an operator is improved.

It is therefore an object of the present invention to provide a relay which allows for easy functional check, as well as space saving.

BEST MODE FOR CARRYING OUT THE INVENTION

Below, preferred embodiments of the present invention will be described in detail with reference to accompanying drawings.

1. FIRST PREFERRED EMBODIMENT

Figure 1:
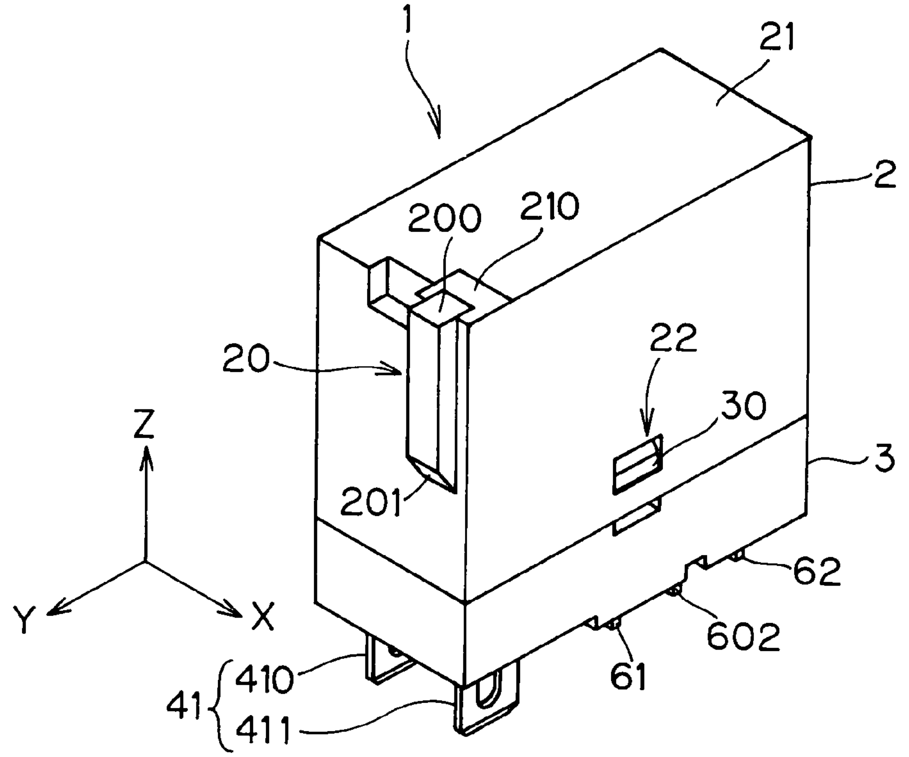
FIG. 1 is a perspective view of an appearance of a relay according to the present invention.
Figure 2:
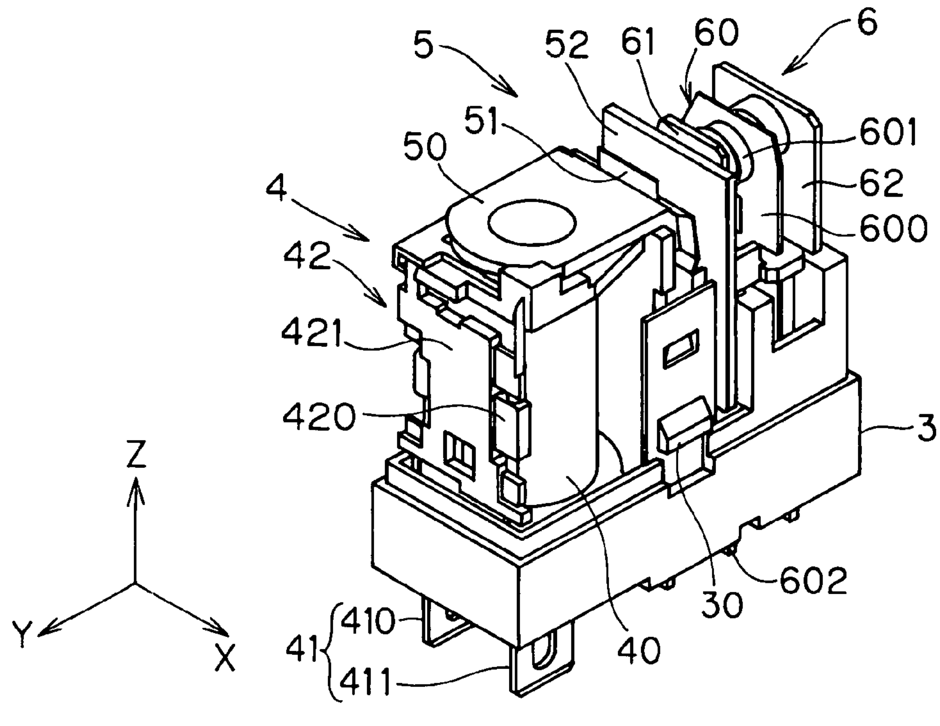
FIG. 2 is a perspective view showing an internal structure of a relay according to a first preferred embodiment.

FIG. 1 is a perspective view of an appearance of a relay 1 according to the present invention. FIG. 2 is a perspective view showing an internal structure of the relay 1.

It is noted that, in FIG. 1 and FIG. 2, a direction of a Z-axis is defined as representing a vertical direction and an X-Y plane is defined as representing a horizontal plane for convenience in illustration and description. However, such definitions are given merely for the sake of convenience in order to understand positional relationships. Thus, respective directions which will be described later should not be limited to the above definitions. This holds true for the other figures which will be later referred to, also.

According to a first preferred embodiment, the relay 1 is configured such that a hollow case 2 and a base 3 are engaged with each other, to thereby protect the interior thereof, as shown in FIG. 1.

The case 2 is formed of light-permeable resin, and is a substantially boxlike component which is open in a direction in which the case 2 is engaged with the base 3 (−Z direction). It is additionally noted that any material that is light-permeable and is strong enough to protect the interior of the relay 1 can be employed as a material forming the case 2. For example, glass (quartz) may be employed as a material forming the case 2.

Because of the light permeability of the case 2 as described above, it is possible to visually recognize the internal structure of the relay 1 from the outside through the case 2, actually. However, for the purpose of facilitating understanding of a profile of the case 2, the internal structure of the relay 1 which can actually be visually recognized from the outside is not illustrated in FIG. 1. The case 2 has an integral structure, and a light guide part 20, a ceiling 21, and a mounting window 22 are formed integrally with the case 2 at the time of forming the case 2.

The light guide part 20 is a columnar (cylindrical) protrusion which protrudes from a side surface of the case 2 which is located in a (+Y) direction, and forms a portion of the case 2. More specifically, the light guide part 20 is provided as a thick portion of the side surface of the case 2 which is located in a (+Y) direction, and is formed of light-permeable resin like the other portions in the case 2.

Also, the light guide part 20 is formed such that the lengthwise direction thereof runs along a Z-axis as shown in FIG. 1. An end surface of the light guide part 20 which is located on a (+Z) side acts as a display surface 200, and the other end surface which is located on a (−Z) side acts as a reflection surface 201. More details of the light guide part 20 will be given later.

The ceiling 21 which is located in a (+Z) direction relative to the other portions in the case 2 is placed to be substantially parallel to an X-Y plane. In the ceiling 21, an area surrounding the display surface 200 of the light guide part 20 acts as a diffuse reflection surface 210 to which roughening such as graining or a matte finish, for example, is applied. As a result, light incident upon the diffuse reflection surface 210 surrounding the display surface 200 is diffusely reflected, so that the condition of the display surface 200 is emphasized, resulting in improved visibility of the display surface 200.

In side surfaces of the case 2 which are opposite to each other along an X-axis, rectangular mounting windows 22 which respectively penetrate the side surfaces are formed to oppose each other. In assembling the relay 1, the case 2 is attached to the base 3 by engaging mounting hooks 30 of the base 3 with the mounting windows 22.

The base 3 functions as a foundation of respective components of the relay 1. The components of the relay 1 are principally attached to the base 3 from a (+Z) direction. Also, terminals of the relay 1 (for example, coil terminals 41) are attached to the base 3 such that the terminals penetrate the base 3, entering from a (+Z) direction and going out in a (−Z) direction, to be exposed to the outside of the base 3. By connecting the exposed terminals to a preset external circuit, electrical connection between the interior and the exterior of the relay 1 is established. A pair of mounting hooks 30 which oppose each other along an X-axis are formed in the base 3. The pair of mounting hooks 30 are engaged with the mounting windows 22 as described above.

As shown in FIG. 2, a coil unit 4, an oscillation part 5, and a contact unit 6 are housed within the relay 1 while being attached to the base 3.

The coil unit 4 includes a coil 40, coil terminals 41 (including terminals 410 and 411), and an indicator unit 42, and forms a magnetic field used for oscillating an armature 50 of the oscillation part 5.

The coil 40 of the coil unit 4 is excited in response to application of a voltage to the coil terminals 41, and forms the foregoing magnetic field with the use of a core which is included in the coil 40 but is not shown.

The indicator unit 42 includes a light emitting device 420 and a support member 421 for keeping the light emitting device 420 in a predetermined position. The indicator unit 42 is a unit for indicating whether or not a voltage is applied to the coil terminals 41 with the use of illuminating light.

The light emitting device 420 is connected to the coil terminals 41 via a wire laid in the support member 421. The light emitting device 420 lights up when a voltage is applied to the coil terminals 41, and extinguishes when no voltage is applied to the coil terminals 41. In other words, the coil terminals 41 serve also as terminals for supplying power to the light emitting device 420.

Illuminating light emitted from the light emitting device 420 travels principally toward a (+Y) side of the relay 1. It is additionally noted that though an LED device is employed as the light emitting device 420 in the relay 1 according to the first preferred embodiment, the light emitting device 420 is not limited to an LED device, of course, and may be formed of a neon tube, for example. In fact, any device that lights up or extinguishes depending on whether or not a voltage is applied to the coil terminals 41 can be employed as the light emitting device 420.

The oscillation part 5 includes an armature 50, a hinge spring 51, and a card 52, and transmits a driving force generated as a result of an electromagnetic interaction between the coil 40 and the armature 50 (which is based mainly on the action of generating an attractive force between the coil 40 and the armature 50), to a common terminal part 60. Also, the oscillation part 5 transmits a driving force generated based on the impetus of the hinge spring 51 (the driving force serving mainly to return the card 52 in a (+Y) direction), to the common terminal part 60.

The armature 50 is a component in the form of a plate, of which end portion on a (−Y) side is bent in a (−Z) direction. The armature 50 is formed of a material which causes an electromagnetic interaction with the excited coil 40 (iron, for example). Though details of the armature 50 are not shown, the end portion of the armature 50 which is located on a (−Y) side serves as a pushing part for pushing the card 52 in a (−Y) direction via the hinge spring 51.

The hinge spring 51 is elastic and is formed of stainless steel, and functions to drive the end portion of the armature 50 which is located on a (−Y) side in a (+Y) direction. Also, the hinge spring 51 is engaged with the card 52, and attracts and drives the card 52 in a (+Y) direction.

As a result, while the coil 40 is not excited, the armature 50 turns around the bent portion thereof (a shaft substantially parallel to an X-axis), so that the armature 50 moves in a direction in which the armature 50 gets away from the coil 40 (core) (i.e., substantially in a (+Z) direction). Since the end portion of the armature 50 which is located on a (−Y) side moves in a (+Y) direction to get away from the coil 40, the card 52 moves in a (+Y) direction because of the impetus of the hinge spring 51.

The card 52 is engaged with the common terminal part 60, and thus moves integrally with the common terminal part 60. More specifically, when the card 52 moves in a (+Y) direction, also the common terminal part 60 is bent in a (+Y)

direction. On the other hand, when the card 52 moves in a (−Y) direction, also the common terminal part 60 is bent in a (−Y) direction.

The contact unit 6 includes the common terminal part 60, a normally-close contact terminal 61, and a normally-open contact terminal 62, and functions to perform switching of a circuit in accordance with a driving force transmitted from the oscillation part 5. Each of the common terminal part 60, the normally-close contact terminal 61, and the normally-open contact terminal 62 is exposed to the outside of the base 3, and is ready to be electrically connected with an external circuit. Respective end portions of the normally-close contact terminal 61 and the normally-open contact terminal 62 which are located on a (+Z) side oppose each other along a Y-axis with a predetermined space being left therebetween, and the common terminal part 60 is placed between the normally-close contact terminal 61 and the normally-open contact terminal 62.

The common terminal part 60 includes a movable spring 600 which is elastic along a Y-axis and is substantially in the form of a strip, a movable contact 601 which penetrates the movable spring 600, and a common terminal 602 secured to the base 3, though details thereof are not shown. The movable spring 600 has an end portion on a (−Z) side secured to the common terminal 602.

Further, the movable spring 600 is engaged with the card 52 of the oscillation part 5 in a predetermined position. The point where the movable spring 600 and the card 52 are engaged with each other corresponds to a point of application of a driving force transmitted to the common terminal part 60. The common terminal 602 is exposed to the outside while being attached to the base 3, and stands still even if oscillation occurs in the oscillation part 5.

Thus, along with movement of the card 52, the movable spring 600 oscillates along a Y-axis using a point where the movable spring 600 is secured to the common terminal 602 as a fulcrum, like a pendulum. The oscillation of the movable spring 600 then causes the position of the movable contact 601 to move along a Y-axis.

In order to ensure contact between the movable contact 601 and each of the normally-close contact terminal 61 and the normally-open contact terminal 62, protrusions (contacts) are provided in respective end portions of the normally-close contact terminal 61 and the normally-open contact terminal 62, which portions are located on a (+Z) side. Each of the protrusions is placed in a position opposing the movable contact 601. Each of the normally-close contact terminal 61 and the normally-open contact terminal 62 is secured to the base 3, and always stands still.

Operations for switching a contact in the relay 1 will be described as follows. While no voltage is applied to the coil 40 through the coil terminals 41, the card 52 is driven in a (+Y) direction because of the impetus of the hinge spring 51.

As a result, the movable spring 600 of the common terminal part 60 which is engaged with the card 52 is attracted in a (+Y) direction. This causes the movable contact 601 attached to the movable spring 600 to come into contact with the normally-close contact terminal 61 and to get away from the normally-open contact terminal 62. In other words, while no voltage is applied to the coil terminals 41, there is continuity between the common terminal part 60 and the normally-close contact terminal 61, and conversely, connection between the common terminal part 60 and the normally-open contact terminal 62 is broken.

On the other hand, when a voltage is applied to the coil terminals 41 of the coil 40, a magnetic field ranging from the core of the coil 40 which is not shown to the armature 50 is generated, so that the armature 50 is attracted toward an upper end of the core against an impetus of the hinge spring 51. In short, the armature 50 oscillates as a result of an electromagnetic interaction between the coil 40 and the armature 50.

The above movement of the armature 50 is transmitted to the movable spring 600 of the common terminal part 60 via the card 52, so that the movable spring 600 is pushed out to a side on which the normally-open contact terminal 62 is placed (in a (−Y) direction). As a result, continuity is caused between the common terminal part 60 (movable contact 601) and the normally-open contact terminal 62. Conversely, the movable contact 601 gets away from the normally-close contact terminal 61, so that connection between the common terminal part 60 and the normally-close contact terminal 61 is broken.

Hereinabove, the functions and the structure of the relay 1 according to the first preferred embodiment have been described. Next, problems associated with conventional arts, together with a manner in which illuminating light emitted from the light emitting device 420 is guided toward the ceiling 21 of the case 2 by the light guide part 20 of the relay 1, will be described in detail.

Figure 3:
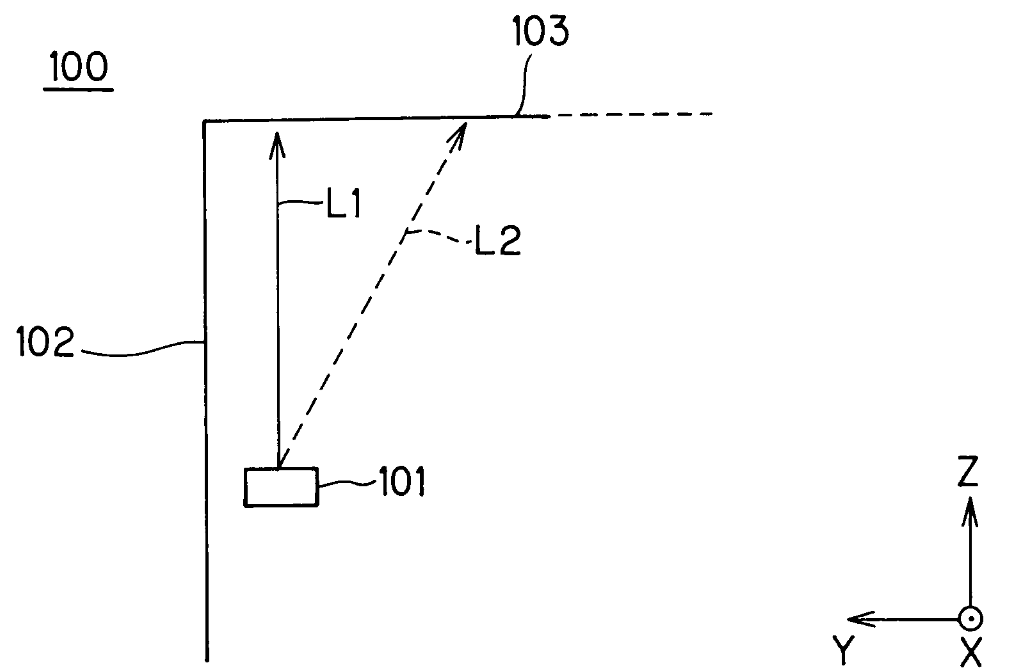
FIG. 3 shows an operation indicator in a compact relay according to the conventional arts.
Figure 4:
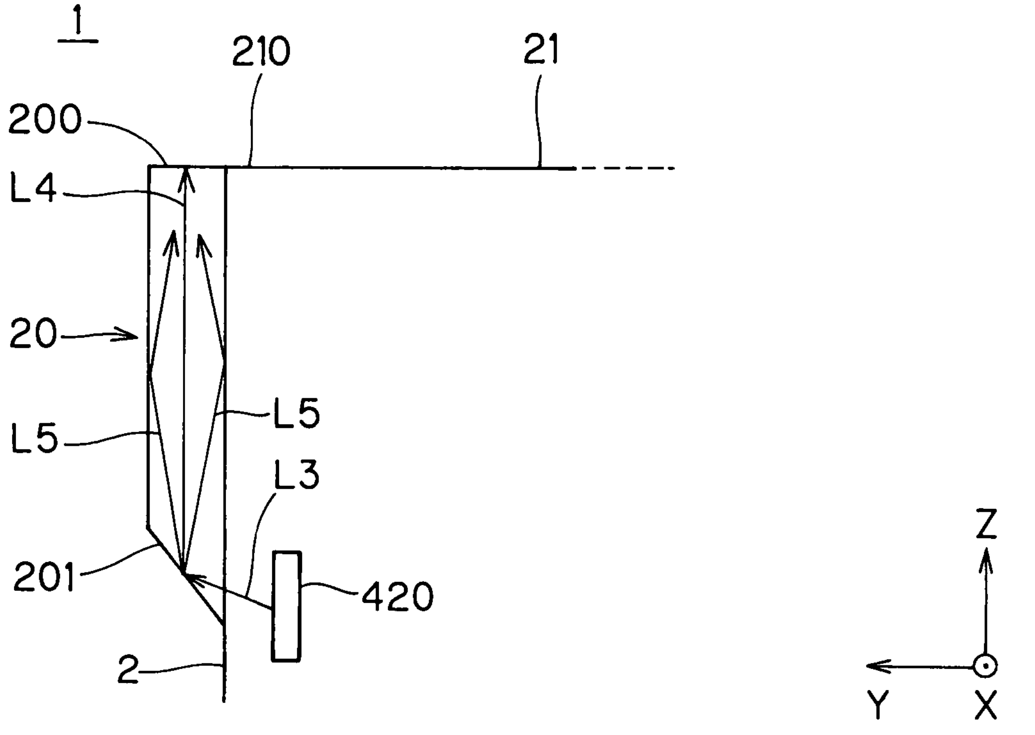
FIG. 4 is a partial sectional view of the relay according to the first preferred embodiment, for showing a positional relationship between a light guide part and a light emitting device therein

FIG. 3 shows an operation indicator 101 included in a compact relay 100 according to the conventional arts. FIG. 4 is a partial sectional view of the relay 1 according to the first preferred embodiment, for showing a positional relationship between the light guide part 20 and the light emitting device 420 in the relay 1.

As described above, in a relay, there is a need for confirming whether or not switching of a circuit is properly carried out when a voltage is applied to a coil. In confirming the foregoing matter, a lighting situation of an operation indicator is checked to see whether or not a voltage is applied to a coil (relay), and when the operation indicator lights up, a determination is made as to whether or not switching of a circuit is properly carried out, depending on operations of a circuit in which the relay is used, in general.

In the meantime, not only a relay but also each of other electronic components is mounted onto a circuit board, adjacent to a different electronic component. For this reason, an operator is unable to visually recognize a bottom surface (mounting surface) of an electronic component. Also, a side surface of an electronic component is shielded by a different electronic component. As such, in a commonly-used electronic component, a top surface (a surface opposing a mounting surface) is located in the position that is the easiest for an operator to visually recognize. Thus, it is preferable that a display surface of a relay is provided in a top surface of the relay.

The relay 100 is too compact to save a space for the operation indicator 101 in the vicinity of a top surface thereof. Accordingly, the operation indicator 101 is placed in a relatively low position within a case 102 as shown in FIG. 3. When the operation indicator 101 is placed in such a low position, the operation indicator 101 emits illuminating light upwardly so that an operator can perceive the light as easily as possible. In other words, the operation indicator 101 is placed to emit illuminating light along an optical path L1.

However, even though the operation indicator 101 emits illuminating light upwardly, the emitted illuminating light diffuses in various directions. For example, a part of the emitted illuminating light which travels along an optical path L2 is shielded by internal components (such as a coil) within the relay 100 and comes short of the sight of an operator. As such, in a case where the operation indicator 101 is placed in a relatively low position, only a small part of the entire emitted illuminating light travels along the optical path L1, so that the amount of light which reaches a display surface 103 is small. Thus, the operation indicator 101 is unable to efficiently illuminate the display surface 103 of the relay 100, resulting in reduced visibility.

In the foregoing case, an operator should take the trouble to crane to get a good look at the relay 100, to directly check the operation indicator 101, for the purpose of achieving a reliable functional check. In other words, the relay 100 according to the conventional arts has a disadvantage of poor visibility of the operation indicator 101, which limits a posture or a position of an operator who makes a functional check.

One possible method to overcome the foregoing disadvantage is to guide illuminating light emitted from the operation indicator 101 to a top surface of a relay through a light guide part such as an optical fiber, for example. Such method allows illuminating light emitted from the operation indicator 101 to be guided to a top surface of a relay with no light being attenuated, to thereby efficiently illuminate the display surface 103. Nonetheless, the foregoing method requires an increased number of components, which results in an increase in cost. Also, since there is a danger that a light guide part such as an optical fiber suffers damage if it is placed outside of a relay, another problem of requiring a further space for the light guide part within the relay is caused.

Referring to FIG. 4, the relay 1 according to the first preferred embodiment is as compact as the relay 100, and the light emitting device 420 which corresponds to the operation indicator 101 is placed in a relatively low position (a position far from the display surface 200).

The light emitting device 420 emits illuminating light not toward the display surface 200 but substantially in a (+Y) direction (so that the light travels along an optical path L3 shown in FIG. 4). The illuminating light is incident upon a side surface of the case 2 (a surface which is substantially parallel to an X-Z plane). Since illuminating light is incident upon the case 2 at nearly right angles as described above, an amount of light which is reflected by an inner surface of the case 2, out of illuminating light emitted from the light emitting device 420, is relatively small.

It is noted that the light emitting device 420 emits illuminating light in a direction which is slightly shifted in a (+Z) direction with respect to a (+Y) direction (i.e., along the optical path L3), though such shifting is somewhat emphasized in illustration of FIG. 4. More specifically, in the relay 1, the light emitting device 420 is placed in a position where illuminating light emitted from the light emitting device 420 can have a small angle of elevation, in order to allow the illuminating light to be almost totally reflected by a reflection surface 201 of the light guide part 20. A proper value of an angle of elevation can be obtained by conducting experiments and the like in advance.

Further, a position where illuminating light emitted from the light emitting device 420 is incident upon the case 2 is relatively close to the light emitting device 420. Accordingly, an amount of light which is attenuated by the time when the emitted illuminating light is incident, out of the entire emitted illuminating light, is relatively small. Thus, most of illuminating light emitted from the light emitting device 420 is incident upon the light guide part 20 in the relay 1.

Illuminating light incident upon the light guide part 20 travels substantially in a (+Y) direction, and is let out of the case 2 from the reflection surface 201. However, since a tilt angle of the reflection surface 201 with respect to an X-Y plane and a position on a Z-axis of the reflection surface 201 are set such that illuminating light can be almost totally reflected, only a small part of the illuminating light is let out of the case 2 (leaks) from the reflection surface 201.

The more exactly the optical path L4 of illuminating light which is reflected by the reflection surface 201 and travels within the light guide part 20 is parallel to a Z-axis, the smaller amount of illuminating light will leak from a side surface of the light guide part 20 (a surface which is substantially parallel to a Z-axis) and the greater amount of illuminating light will reach the display surface 200. Accordingly, the reflection surface 201 is placed to be able to reflect illuminating light emitted from the light emitting device 420 (along the optical path L3) substantially in a (+Z) direction in the relay 1 according to the first preferred embodiment.

As a result, illuminating light which has been traveling substantially in a (+Y) direction is reflected substantially in a (+Z) direction by the reflection surface 201, and then travels toward the display surface 200 in the relay 1. It is additionally noted that out of illuminating light reflected by the reflection surface 201, a part which diffuses on the way to the display surface 200 (illuminating light traveling along an optical path L5, for example) is almost totally reflected by a side surface of the light guide part 20. Accordingly, an amount of illuminating light which leaks from the side surface of the light guide part 20 is reduced, so that the illuminating light can be efficiently guided to the display surface 200. That is, the display surface 200 is efficiently illuminated, resulting in improved visibility thereof to an operator.

As described above, the display surface 200 and the light guide part 20 which guides a part out of light emitted from the light emitting device 420, which part travels toward other than the display surface 200, toward the display surface 200, are formed as integral parts forming the case 2 in the relay 1 according to the first preferred embodiment. As a result, the light emitting device 420 can be placed in an arbitrary position without increasing the number of components, regardless of a position of the display surface 200. Therefore, it is possible to effectively use a space while suppressing an increase in cost.

Further, because of the position of the display surface 200 which is placed in the top surface (the ceiling 21) of the case 2, an operator is able to easily visually recognize a lighting situation of the light emitting device 420.

Further, because of the position of the light emitting device 420 which is placed in the vicinity of the coil terminals 41, wiring can be simplified, to allow for space saving.

Further, regarding the reflection surface 201 for reflecting light emitted from the light emitting device 420 toward the display surface 200, the position of the reflection surface 201 and the angle at which the reflection surface 201 is placed are set such that illuminating light emitted from the light emitting device 420 toward the reflection surface 201 can be almost totally reflected, depending on relative positions of the case 2 and the light emitting device 420. This makes it possible to efficiently guide illuminating light to the display surface 200.

Further, roughening is applied to a surface of the case 2 which surrounds the display surface 200 (i.e., the diffuse reflection surface 210). Thus, by scattering light leaking from a circumference of the display surface 200, it is possible to emphasize the condition of the display surface 200. Accordingly, the visibility of the display surface 200 to an operator is improved.

2. SECOND PREFERRED EMBODIMENT

The above first preferred embodiment has discussed an example in which the light emitting device 420 emits illuminating light toward other than the display surface 200, and the light guide part 20 guides the emitted illuminating light toward the display surface 200. However, in a case where a space can be provided between the light emitting device 420 and the display surface 200, a structure which allows the light emitting device 420 may be configured to emit illuminating light toward the display surface 200.

Figure 5:
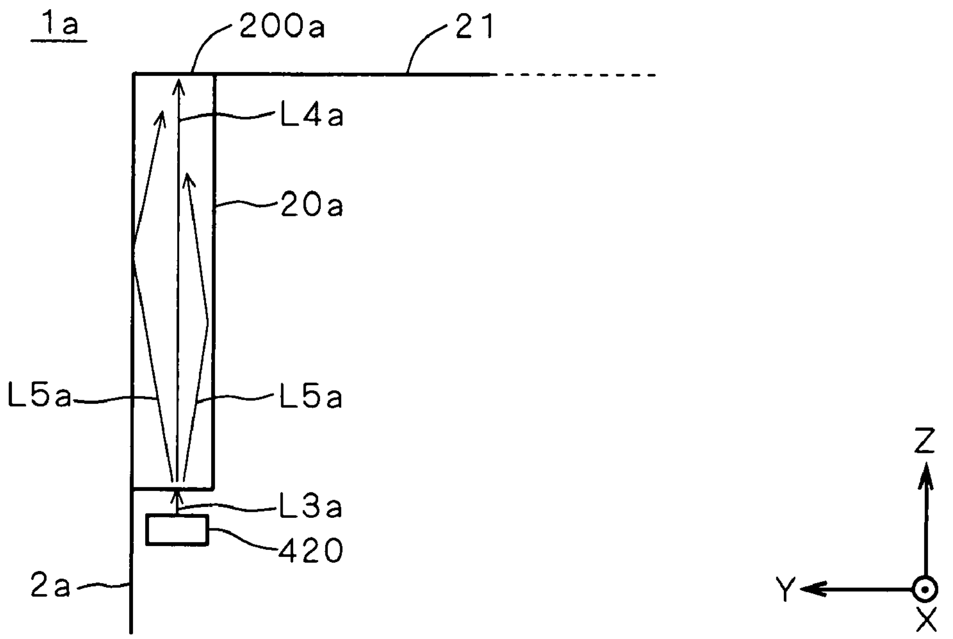
FIG. 5 is a partial sectional view of a relay according to a second preferred embodiment, for showing a positional relationship between a light guide part and a light emitting device therein.
Figure 6:
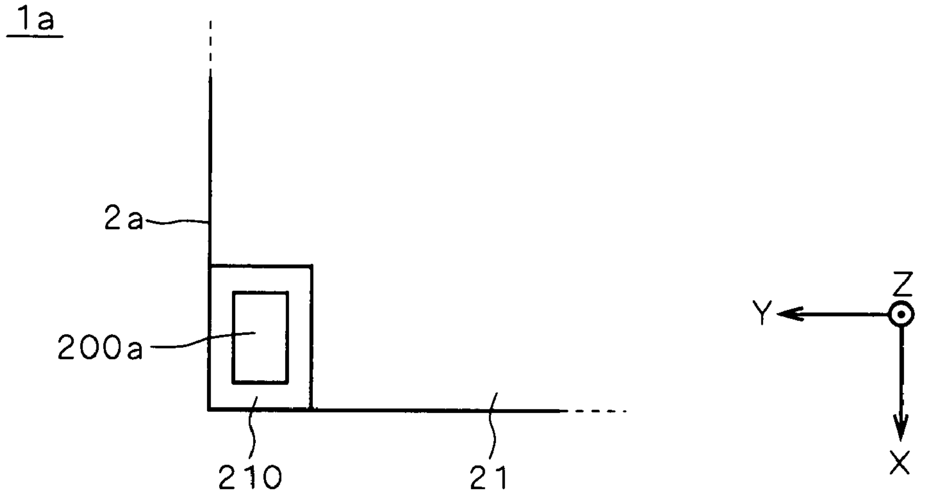
FIG. 6 is a top plan view of the relay according to the second preferred embodiment when viewed from above.

FIG. 5 is a partial sectional view of a relay 1*a* according to a second preferred embodiment, for showing a positional relationship between a light guide part and the light emitting device 420 in the relay 1*a*. Also, FIG. 6 is a partial plan view of the relay 1*a* when viewed from above. It is noted that components having substantially the same functions and substantially the same structures in the relay 1*a* according to the second preferred embodiment and the relay 1 according to the first preferred embodiments are denoted by the same reference numerals, and description thereof will be appropriately omitted hereinafter.

A light guide part 20*a* provided in a case 2*a* of the relay 1*a* is formed as a thick portion obtained by inwardly thickening a portion of the case 2*a*. That is, the light guide part 20*a* is formed as an integral part of the case 2 in the same manner as in the first preferred embodiment.

An end surface of the light guide part 20*a* which is located on a (+Z) side acts as a display surface 200*a*, and is placed to form a surface which is flush with a ceiling 21 of the case 2*a*. Also, an end surface of the light guide part 20*a* which is located on a (−Z) side is placed to be substantially horizontal. It is noted that an area surrounding the display surface 200*a* acts as a reflection surface 210 to which roughening is applied also in the relay 1*a* according to the second preferred embodiment, as shown in FIG. 6.

According to the second preferred embodiment, the light emitting device 420 is placed to be able to emit illuminating light along an optical path L3*a* which extends in a (+Z) direction. In other words, the light emitting device 420 is placed to emit illuminating light toward the display surface 200*a*.

Illuminating light which is emitted from the light emitting device 420 and travels along the optical path L3*a* is incident upon the interior of the light guide part 20*a*, entering from the end surface of the light guide part 20*a* which is located on a (−Z) side. At that time, an angle between the end surface of the light guide part 20*a* which is located on a (−Z) side and the optical path L3*a* (the incident angle of illuminating light) is nearly equal to right angles, so that the illuminating light can be incident upon the light guide part 20*a* with little thereof being reflected.

Out of the incident illuminating light, a part which travels along an optical path L4*a* travels directly toward the display surface 200*a*. On the other hand, also the other part of the incident illuminating light which travels along an optical path L5*a* extending in a direction in which the light is scattered is reflected by a surface of the light guide part 20*a*, to be guided toward the display surface 200*a*.

As such, in the relay 1*a* according to the second preferred embodiment, like the conventional compact relay 100, illuminating light is emitted toward the display surface 200*a*. Nonetheless, an amount of light which is attenuated (scattered) on the way to the display surface 200*a* can be reduced because of provision of the light guide part 20*a*, so that it is possible to efficiently illuminate the display surface 200*a*. It is additionally noted that the shorter the distance of the optical path L3*a* is, the smaller amount of illuminating light will leak. Thus, it is preferable that a distance between the end surface of the light guide part 20*a* which is located on a (−Z) side and the light emitting device 420 is short.

As is made clear from the above description, even in a case where the light emitting device 420 emits illuminating light toward the display surface 200*a*, the light guide part 20*a* can efficiently guide the illuminating light toward the display surface 200*a*. That is, the same effects as produced in the first preferred embodiment can be produced by the relay 1*a* according to the second preferred embodiment.

Further, since the light guide part 20*a* is provided on the inner side of the case 2*a*, the outer size of the relay 1*a* can be reduced.

3. MODIFICATIONS

Hereinabove, the preferred embodiments of the present invention have been described. However, the present invention is not limited to the above-described preferred embodiments, and various modifications are possible.

For example, though one common terminal part 60, one normally-close contact terminal 61, and one normally-open contact terminal 62 are provided in the above-described preferred embodiments, each of the numbers of those components is not limited to one. That is, two or more sets each including the common terminal part 60, the normally-close contact terminal 61, and the normally-open contact terminal 62 may be provided, which allows switching of plural circuits to be simultaneously carried out.

Also, illuminating light emitted from the light emitting device 420 can have any wavelength that falls within a range of a wavelength of visible light. Accordingly, for the relays 1 and 1*a* which are used for different purposes, by adapting the light emitting devices 420 respectively included in the relays 1 and 1*a* to emit illuminating light in different colors, the efficiency in an operator's check can be increased, for example.

Further, though each of the cases 2 and 2*a* is defined merely as being formed of a light-permeable material in the above-described preferred embodiments, each of the cases 2 and 2*a* may be colored or a fluorescent material may be mixed into the material forming each of the cases 2 and 2*a*, so that the wavelength of a part of light emitted from the light emitting device 420, which part passes through each of the cases 2 and 2*a* (i.e., light emitted to the outside from the display surface 200 or 200*a*), may be limited to some value. In this manner, it is possible to cause the display surface 200 or 200*a* to glow in an arbitrary color by using the light emitting device 420 which is the same as described above.

Moreover, the display surfaces 200 and 200*a* illuminated by illuminating light do not necessarily need to be provided in the ceilings 21 of the relays 1 and 1*a*, respectively. For example, if a side surface or the like of the relay 1 or 1*a* is a portion which is easier for an operator to look at, depending on the position of the relay 1 or 1*a*, the relay 1 or 1*a* may be configured such that illuminating light emitted from the light emitting device 420 is guided to a side surface of the case 2 or 2*a* by extending the light guide part 20 or 20*a* to the side surface of the relay 1 or 1*a*. In short, each of the display surfaces 200 and 200*a* can be placed in any position that can be easily visually recognized by an operator.

The invention claimed is:

1. A relay for opening and closing a circuit by an electromagnetic interaction between a coil and an oscillation part, comprising:

a hollow box for housing said coil and said oscillation part; and an illuminating part which lights up depending on a supply situation of power supplied to said coil, wherein said box includes: a display surface placed in a predetermined position; and a light guide part for guiding light emitted from said illuminating part toward said display surface, and said display surface and said light guide part are formed as integral parts forming said box.

2. The relay according to claim 1, wherein said light guide part guides light traveling toward other than said display surface of said light emitted from said illuminating part, toward said display surface.

3. The relay according to claim 2, wherein said light guide part includes a reflection surface for reflecting said light emitted from said illuminating part toward said display surface, and a position of said reflection surface and an angle at which said reflection surface is placed are set such that said reflection surface almost totally reflects said light emitted from said illuminating part toward said reflection surface, depending on relative positions of said box and said illuminating part.

4. The relay according to any of claims 1 through 3, wherein surface roughening is applied to an area of said box, which area surrounds said display surface.

* * * * *